United States Patent
Zhao et al.

(10) Patent No.: US 11,101,575 B2
(45) Date of Patent: Aug. 24, 2021

(54) WEARABLE DEVICE, AND ANTENNA SIGNAL PROCESSING CIRCUIT AND METHOD THEREFOR

(71) Applicant: GOERTEK INC., Shandong Province (CN)

(72) Inventors: Xin Zhao, Shandong Province (CN); Yuge Zhu, Shandong Province (CN)

(73) Assignee: GOERIEK INC., Shandong (CN)

( * ) Notice: Subject to any disclaimer, the term of this patent is extended or adjusted under 35 U.S.C. 154(b) by 139 days.

(21) Appl. No.: 16/472,717

(22) PCT Filed: Dec. 7, 2017

(86) PCT No.: PCT/CN2017/114972
§ 371 (c)(1),
(2) Date: Jun. 21, 2019

(87) PCT Pub. No.: WO2018/121207
PCT Pub. Date: Jul. 5, 2018

(65) Prior Publication Data
US 2019/0372242 A1      Dec. 5, 2019

(30) Foreign Application Priority Data

Dec. 29, 2016   (CN) .......................... 201611249918.5

(51) Int. Cl.
*H01Q 23/00*       (2006.01)
*H01Q 1/27*        (2006.01)
(52) U.S. Cl.
CPC ............. *H01Q 23/00* (2013.01); *H01Q 1/273* (2013.01)

(58) Field of Classification Search
CPC .............................. H01Q 23/00; H01Q 1/273
See application file for complete search history.

(56) References Cited

U.S. PATENT DOCUMENTS 6,081,700 A      6/2000  Salvi et al.

FOREIGN PATENT DOCUMENTS

| CN | 102420353 A | 4/2012 |
|---|---|---|
| CN | 104639200 A | 5/2015 |
| CN | 105978589 A | 9/2016 |
| CN | 106785339 A | 5/2017 |
| CN | 206480752 U | 9/2017 |

*Primary Examiner* — Graham P Smith
(74) *Attorney, Agent, or Firm* — LKGlobal | Lorenz & Kopf, LLP (57) ABSTRACT

A wearable device and an antenna signal processing circuit and method thereof are disclosed. The antenna signal processing circuit comprises: an antenna tuning circuit, a signal processor and a comparator. The antenna tuning circuit comprises a controlling end, a load end and a signal source end. The load end is connected to an antenna of the wearable device, the signal source end is connected to a first input end of the comparator, a reference signal is inputted to a second input end of the comparator, an output end of the comparator is connected to an input end of the signal processor, and an output end of the signal processor is connected to the controlling end. The signal processor generates an adjusting signal according to a comparison result outputted by the comparator, to adjust a matching impedance of the antenna tuning circuit, to realize dynamic adjusting of antenna signals.

20 Claims, 2 Drawing Sheets

FIG. 5

WEARABLE DEVICE, AND ANTENNA SIGNAL PROCESSING CIRCUIT AND METHOD THEREFOR

CROSS REFERENCE TO RELATED APPLICATIONS

This application is a U.S. National Stage entry under 35 U.S.C. § 371 based on International Application No. PCT/CN2017/114972, filed on Dec. 7, 2017, which was published under PCT Article 21(2) and which claims priority to Chinese Patent Application No. 201611249918.5, filed on Dec. 29, 2016. Both of these applications are hereby incorporated herein in their entirety by reference.

TECHNICAL FIELD

This application pertains to the field of wearable devices, and more particularly to a wearable device and an antenna signal processing circuit and method thereof.

BACKGROUND

In the antenna designing process of wearable devices, such as when the antenna of a smart watch is being designed, since the volume of the smart watch is limited, usually factors such as the antenna tuning circuit of the smart watch and the antenna environment are all fixed after the antenna designing in the smart watch is completed, and correspondingly, the antenna performance of the smart watch is also fixed. However, due to the changes of the usage environments of the smart watch, such as individual differences and individual wearing postures, the antenna performance of the smart watch becomes worse, which ultimately affects the user experience. In addition, other objects, desirable features and characteristics will become apparent from the subsequent summary and detailed description, and the appended claims, taken in conjunction with the accompanying drawings and this background.

SUMMARY

In view of the above problems, an object of the present disclosure is to provide an antenna signal processing circuit and method of a wearable device to solve the problem that the antenna performance of the wearable device cannot be dynamically adjusted according to the changes of the usage environment and thus the antenna performance becomes worse.

In order to achieve the above object, the technical solutions of the present disclosure are as follows:

In one aspect, the present disclosure provides an antenna signal processing circuit of a wearable device, wherein the antenna signal processing circuit comprises: an antenna tuning circuit, a signal processor and a comparator;

the antenna tuning circuit comprises a controlling end, a load end and a signal source end, the load end is connected to an antenna of the wearable device, the signal source end is connected to a first input end of the comparator, a reference signal is inputted to a second input end of the comparator, an output end of the comparator is connected to an input end of the signal processor, and an output end of the signal processor is connected to the controlling end; and the signal processor generates an adjusting signal according to a comparison result outputted by the comparator, to adjust a matching impedance of the antenna tuning circuit, to realize dynamic adjusting of antenna signals.

In another aspect, the present disclosure further provides a method for processing an antenna signal of a wearable device, comprising:

obtaining an antenna signal from a signal source end of an antenna tuning circuit and sending the antenna signal to a comparator, wherein the antenna tuning circuit comprises a controlling end, a load end, and the signal source end, the load end is connected to an antenna of the wearable device, the signal source end is connected to a first input end of the comparator, a reference signal is inputted to a second input end of the comparator, an output end of the comparator is connected to an input end of the signal processor, and an output end of the signal processor is connected to the controlling end;

comparing a signal intensity of the antenna signal with a signal intensity of the reference signal by using the comparator, to obtain a comparison result; and adjusting a matching impedance of the antenna tuning circuit according to the comparison result, to realize dynamic adjusting of antenna signals.

According to another object of the present disclosure, the present disclosure provides a wearable device to solve the problem of wearable devices that the antenna signal quality deteriorates due to individual differences or wearing differences.

To achieve the above objective, the present disclosure provides a wearable device comprising the antenna signal processing circuit described above.

The advantageous effects of the present disclosure are as follows. In the present disclosure, an antenna signal after being processed by the antenna tuning circuit is sent to the comparator and compared with a reference signal, rather than comparing the RSSI (Received Signal Strength Indication) value of the signal from the baseband processing circuit with the signal intensity value of the reference signal. Thus, the signal processor can compare an intensity value of a real antenna signal with an intensity value of a reference signal, and accurately adjust the matching impedance of the antenna tuning circuit according to the comparison result, and then the antenna tuning circuit can use the adjusted matching impedance to perform matching processing on the subsequent antenna signals from the antenna, so that the influence of individual differences or wearing differences on the antenna performance of the wearable device can be avoided. By changing the matching impedance of the antenna tuning circuit, and optimizing the antenna performance, the antenna of the wearable device can work at an optimal state, and the performance of antenna signals can be improved.

BRIEF DESCRIPTION OF DRAWINGS

The present invention will hereinafter be described in conjunction with the following drawing figures, wherein like numerals denote like elements, and.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

In order to make the objectives, technical solutions and advantages of the present disclosure clearer, the present disclosure is further described in detail below with reference to the accompanying drawings and the present embodiments.

The antenna performance of a wearable device such as a smart watch is determined after the antenna design is completed. The antenna at the design stage is only suitable for the antenna environment when the wearable device is designed or tested. When the usage environment of the wearable device changes, such as when the smart watch is being used, the antenna performance will be deteriorated due to external factors such as differences between individual wrists and bodies, especially when the quality of the antenna signal received by the wearable device becomes worse. Therefore, the present disclosure provides a technical solution for dynamically optimizing the antenna performance.

The basic inventive concept of the present disclosure is providing an antenna tuning circuit with an adjustable matching impedance, generating an antenna tuning signal after the antenna tuning circuit performs impedance matching processing on the antenna signal from the antenna, comparing the antenna tuning signal with the reference signal, and when the quality of the antenna tuning signal is worse than the quality of the reference signal, adjusting the quality of the antenna signal by adjusting the matching impedance of the antenna tuning circuit to improve the quality of the antenna signal.

First Embodiment

Figure 1:
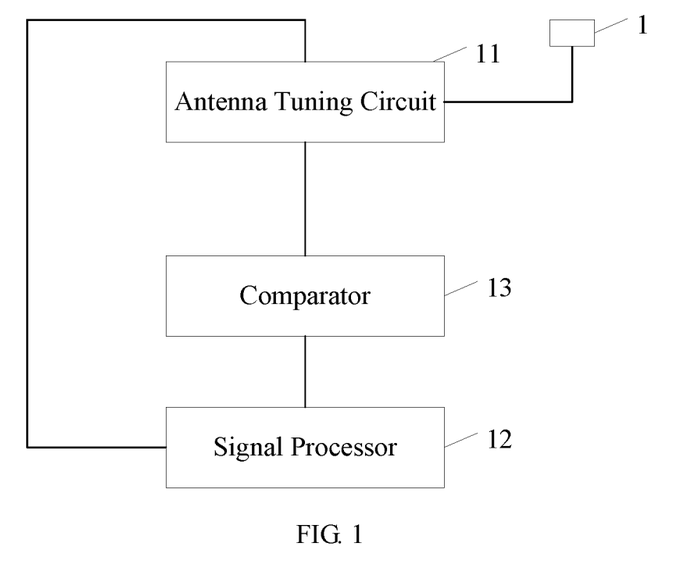
FIG. 1 is a block diagram of the structure of an antenna signal processing circuit according to an embodiment of the present disclosure.

FIG. 1 is a block diagram of the structure of an antenna signal processing circuit according to an embodiment of the present disclosure. As shown in FIG. 1, the antenna signal processing circuit comprises: an antenna tuning circuit 11, a signal processor 12, and a comparator 13.

The antenna tuning circuit 11 comprises a controlling end, a load end and a signal source end. The load end is connected to an antenna 1 of the wearable device, the signal source end is connected to a first input end of the comparator 13, a reference signal is inputted to a second input end of the comparator 13, an output end of the comparator 13 is connected to an input end of the signal processor 12, and an output end of the signal processor 12 is connected to the controlling end of the antenna tuning circuit 11.

The antenna tuning circuit 11 receives the antenna signal sent by the receiving antenna 1, performs impedance matching processing on the received antenna signal, and sends the matched antenna signal to the comparator 13. The comparator 13 compares the signal intensity of the matched antenna signal and the signal intensity of a reference signal, and sends the comparison result to the signal processor 12. The signal processor 12 generates an adjusting signal according to the comparison result outputted by the comparator 13, to adjust a matching impedance of the antenna tuning circuit.

For example, the signal processor 12 may maintain the current adjusting mode of matching impedance of the antenna tuning circuit when the comparison result is that the signal intensity of the antenna signal is greater than the signal intensity of the reference signal, and change the adjusting mode of the matching impedance of the antenna tuning circuit when the comparison result is that the signal intensity of the antenna signal is less than the signal intensity of the reference signal, so that the antenna tuning circuit can use the adjusted matching impedance to perform matching processing on the subsequent antenna signals from the antenna, thereby realizing dynamic adjusting of antenna signals.

In the present embodiment, the antenna signal after being processed by the antenna tuning circuit is sent to the comparator and compared with the reference signal, rather than comparing the RSSI (Received Signal Strength Indication) value of the signal from the baseband processing circuit with the intensity value of the reference signal. Thus, the signal processor can compare an intensity value of a real antenna signal with an intensity value of a reference signal, and accurately adjust the matching impedance of the antenna tuning circuit according to the comparison result, and then the antenna tuning circuit can use the adjusted matching impedance to perform matching processing on the subsequent antenna signals from the antenna, so that the influence of individual differences or wearing differences on the antenna performance of the wearable device can be avoided. By changing the matching impedance of the antenna tuning circuit, and optimizing the antenna performance, the antenna of the wearable device can work at an optimal state, and the performance of antenna signals can be improved.

In an implementation of the present embodiment, the antenna signal processing circuit in FIG. 1 further comprises a signal detecting circuit and a signal register. An input end of the signal detecting circuit is connected to the signal source end of the antenna tuning circuit 11. Two output ends of the signal detecting circuit are respectively connected to the first input end of the comparator 13 and the signal register. The signal register stores an intensity value of the reference signal and is respectively connected to the signal processor 12 and the second input end of the comparator 13.

The signal detecting circuit detects a signal intensity value from the signal source end of the antenna tuning circuit 11, and sends the detected signal intensity value to the comparator 13 and the signal register respectively. The signal register updates the signal intensity value of the reference signal by using the signal intensity value according to a controlling signal from the signal processor 12, so that the comparator compares a signal intensity value at a next moment with a signal intensity value of the updated reference signal.

In the designing process, the signal processor 12 may generate the controlling signal by using one of the following two modes:

Mode 1: the signal processor 12 generates the controlling signal when receiving the comparison result sent by the comparator 13, that is, receiving that the signal intensity value is greater than the signal intensity value of the reference signal, or the signal intensity value is less than the signal intensity value of the reference signal; and Mode 2: the signal processor 12 generates the controlling signal when the comparison result is that the received signal intensity value is greater than the intensity value of the reference signal, and does not generate the controlling signal when the comparison result is that the received signal intensity value is less than the intensity value of the reference signal.

In this implementation, if the signal processor 12 uses the controlling signal generated by Mode 1, it will not distinguish the difference between the current signal intensity value and the intensity value of the reference signal, and update the intensity value of the reference signal in real time by using the signal intensity value of the current moment, so that the signal intensity value at the next moment is compared with the signal intensity value at the previous moment. Thus, the comparator can compare the signal intensity difference between the adjacent moments, and the signal processor can adjust the matching impedance of the antenna tuning circuit according to the comparison result of signal intensity between the adjacent moments, so that the quality of the antenna signal at the next moment is better than that of the previous moment, to realize dynamic adjusting of antenna signals. On the other hand, if the signal processor 12 uses the controlling signal generated by Mode 2, it will update the intensity value of the reference signal only when the signal intensity value at the current moment is greater than the intensity value of the reference signal, so that the comparator can compare the subsequent signal intensity value with the intensity value of the reference signal which is gradually increased. Thus, the signal processor can adjust the matching impedance of the antenna tuning circuit to be increasingly closer to the optimal value. In practical applications, the signal processor 12 may be designed as required to generate a controlling signal according to any of the above modes.

In practical applications, the antenna signal processing circuit in FIG. 1 further comprises a radio frequency circuit, a baseband processing circuit and a coupler;

wherein an input end of the coupler is connected to the signal source end of the antenna tuning circuit, a first output end of the coupler is connected to one end of the radio frequency circuit, a second output end of the coupler is connected to the input end of the signal detecting circuit. The other end of the radio frequency circuit is connected to the baseband processing circuit. The baseband processing circuit, the radio frequency circuit, the coupler and the antenna tuning circuit form a radio frequency passageway of antenna signals. The antenna signal of the wearable device can be received and sent through the radio frequency passageway.

In the present embodiment, the coupler is a dually-divided signal coupler. When the antenna signal processing circuit processes the antenna signal from the antenna, the coupler divides the matched antenna signal outputted by the antenna tuning circuit into two channels of signals: one is sent to the radio frequency passageway and then sent to the wearable device through the baseband processing circuit to complete the receiving of the antenna signal; and the other is sent to the signal detecting circuit, and generates an adjusting signal for adjusting the matching impedance of the antenna tuning circuit after being processed by the comparator and the signal processor. When the antenna signal processing circuit processes an emitted signal from the wearable device, the coupler sends the emitted signal after being processed by the baseband processing circuit and the radio frequency circuit to the antenna tuning circuit for tuning, and transmits the emitted signal after being tuned through the antenna.

In practical applications, the signal processor and/or the baseband processing circuit may be the central controller of the wearable device to save the design space of the wearable device and reduce the number of components.

In the present embodiment, the antenna tuning circuit has three ports (i.e., a controlling end, a load end and a signal source end). However, as long as the circuit structure of the antenna tuning circuit can receive the adjusting signal through the controlling end to perform matching impedance adjusting, the specific structure of the antenna tuning circuit is not limited herein. In practical applications, the antenna tuning circuit may have a i-type structure, a #-type structure or other types of structure.

Illustratively, in order to facilitate describing the matching impedance adjusting of the antenna tuning circuit by the signal processor, the present embodiment will be described below with reference to FIG. 2.

Figure 2:
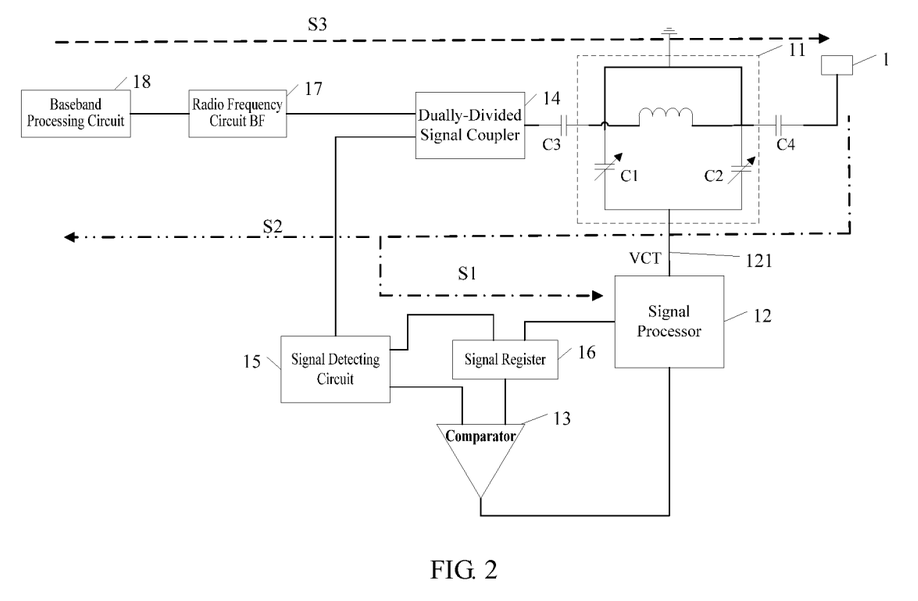
FIG. 2 is a schematic diagram of an antenna signal processing circuit according to an embodiment of the present disclosure.

FIG. 2 is a schematic diagram of an antenna signal processing circuit according to the present embodiment. As shown in FIG. 2, the antenna signal processing circuit comprises: an antenna tuning circuit 11, a signal processor 12, a comparator 13, a dually-divided signal coupler 14, a signal detecting circuit 15, a signal register 16, a radio frequency circuit BF 17, and a baseband processing circuit 18.

The antenna tuning circuit 11 comprises three ports, that is a controlling end, a load end and a signal source end. The load end is connected to the antenna 1 of the wearable device. The signal source end is connected to the input end of the dually-divided signal coupler 14. The first output end of the dually-divided signal coupler 14 is connected to one end of the radio frequency circuit BF 17. The other end of the radio frequency circuit BF 17 is connected to the baseband processing circuit 18. The second output end of the dually-divided signal coupler 14 is connected to the input end of the signal detecting circuit 15. Two output ends of the signal detecting circuit 15 are respectively connected to a first input end of the comparator 13 and a first input end of the signal register 16. The signal register 16 stores the signal intensity value of the reference signal. A second input end of the signal register 16 is connected to the signal processor 12. The output end of the signal register 16 is connected to the second input end of the comparator 13. The output end of the comparator 13 is connected to the input end of the signal processor 12.

Referring to FIG. 2, the antenna signal processing circuit shown in FIG. 2 has three signal paths. The signal processing flow of the signal path S1 is as follows.

The antenna 1 sends the received antenna signal to the antenna tuning circuit 11 for impedance matching processing. The antenna tuning circuit 11 sends the antenna signal after being impedance matching processed to the dually-divided signal coupler 14. The dually-divided signal coupler 14 divides the received signal into two channels of coupled signals according to a set proportion, and sends one channel of coupled signal in the two channels of coupled signals in which the original signal (i.e., the antenna signal after being impedance matching processed) component is relatively less to the signal detecting circuit 15, and the other channel of coupled signal in which the original signal component is relatively more to the radio frequency circuit BF 17.

For example, the received antenna signal after being impedance matching processed is divided into two channels of coupled signals according to a proportion of 2:8: one channel of coupled signal is 80% of the original signal and is sent to the radio frequency circuit BF 17, and the other channel of coupled signal is 20% of the original signal and is sent to the signal detecting circuit 15.

The signal detecting circuit 15 detects the signal intensity value of the received coupled signal, and sends the detected signal intensity value to the comparator 13. The comparator 13 compares the signal intensity value of the coupled signal from the signal detecting circuit 15 with the signal intensity value of the reference signal from the signal register 16, and the comparison result is sent to the signal processor 12. The signal processor 12 generates an adjusting signal according to the comparison result to adjust the matching impedance of the antenna tuning circuit 11.

It should be noted that, in the present embodiment, the signal detecting circuit 15 also sends the detected signal intensity value to the signal register 16, and the signal register 16 updates the intensity value of the reference signal by using the signal intensity value according to a controlling signal from the signal processor 12. Therefore, the comparator 13 will compare the signal intensity value at the next moment with the signal intensity value of the updated reference signal. The signal processor 12 may generate the controlling signal by using Mode 1 or Mode 2, the details of which will not be repeated herein.

For example, the antenna tuning circuit of the present embodiment has a π-type structure. Obviously, the antenna tuning circuit may also be designed to have a #-type structure, a T-type structure or other structures.

Referring to FIG. 2, the antenna tuning circuit 11 comprises a first inductor L1, a first capacitor C1, and a second capacitor C2. One end of the first inductor L1 is connected to the load end of the antenna tuning circuit 11, and the other end of the first inductor L1 is connected to the signal source end of the antenna tuning circuit 12. One end of the first capacitor C1 is connected to the signal source end of the antenna tuning circuit 11, and the other end of the first capacitor C1 is grounded. One end of the second capacitor C2 is connected to the load end of the antenna tuning circuit 11, and the other end of the second capacitor C2 is grounded.

The first capacitor C1 and the second capacitor C2 are voltage controlled capacitors. The signal processor 12 comprises a voltage branch 121 for adjusting the capacitance values of the voltage controlled capacitors.

The signal processor 12 increases or decreases the voltage value of the voltage branch 121 by a preset step value according to the comparison result sent by the comparator 13, to correspondingly change capacitance values of the first capacitor C1 and the second capacitor C2, and thus the matching impedance of the antenna tuning circuit is changed. Specifically, the signal processor 12 adjusts the voltage value of the voltage branch according to the current voltage adjusting mode when the signal intensity value at the current moment is not less than the signal intensity value of the reference signal; otherwise, the signal processor 12 changes the voltage adjusting mode, and adjusts the voltage value of the voltage branch according to the changed voltage adjusting mode.

For example, referring to the circuit structure shown in FIG. 2, assuming that the current adjusting mode of the voltage value VCT in the voltage branch 121 by the signal processor 12 is to increase the voltage value by a preset step value, if the comparison result received by the signal processor 12 is that the signal intensity value of the coupled signal at the current moment is greater than the signal intensity value of the reference signal, that indicates that the adjusting mode of the voltage value VCT of the voltage branch 121 is correct, and the signal processor 12 will continue to increase the voltage value VCT of the voltage branch 121 by a preset step value; and if the comparison result received by the signal processor 12 is that the signal intensity value of the coupled signal at the current moment is less than the signal intensity value of the reference signal, that indicates that the adjusting mode of the voltage value VCT of the voltage branch 121 is not correct. At this point the signal processor 12 will decreases the voltage value VCT of the voltage branch 121 by a preset step value, and change the capacitance values of the first capacitor C1 and the second capacitor C2, thereby changing the matching impedance of the antenna tuning circuit to realize dynamic adjusting of antenna signals.

It should be noted that FIG. 2 exemplarily shows that the signal processor 12 comprises one voltage branch, and the voltage branch is used to adjust the capacitance values of the first capacitor C1 and the second capacitor C2 in the antenna tuning circuit to change synchronously. However, in the designing process, the number of the voltage branches in the signal processor may be the same as the number of the voltage controlled capacitors. In other words, the signal processor may comprise a first voltage branch and a second voltage branch, the first voltage branch is used to adjust the capacitance value of the first capacitor C1 in the antenna tuning circuit, and the second voltage branch is used to adjust the capacitance value of the second capacitor C2 in the antenna tuning circuit.

It should be further noted that, in order to avoid the influence of the direct current in the antenna tuning circuit 11 on the antenna signal, the antenna signal processing circuit in the present embodiment may further comprise a first DC blocking capacitor C3 and a second DC blocking capacitor C4. The DC blocking capacitor C3 is connected between the input end of the dually-divided signal coupler 14 and the signal source end of the antenna tuning circuit 11. The second DC blocking capacitor C4 is connected between the load end of the antenna tuning circuit 11 and the antenna 1.

The signal processing flow of the signal path S2 is as follows.

The dually-divided signal coupler 14 divides the received signal into two channels of coupled signals, and sends one of the two channels of coupled signals in which the original signal is relatively more to the radio frequency circuit BF 17. The radio frequency circuit BF 17 demodulates the coupled signal and sends the demodulated signal to the baseband processing circuit 18. The baseband processing circuit 18 performs analog/digital conversion processing on the received demodulated signal, and sends the obtained digital signal to a microprocessor of the wearable device for corresponding processing.

The signal processing flow of the signal path S3 is as follows.

The microprocessor of the wearable device sends an emitted signal to the baseband processing circuit 18 for digital/analog conversion processing, and sends the obtained analog signal to the radio frequency circuit BF 17. The radio frequency circuit BF 17 modulates the analog signal, and sends the modulated signal to the dually-divided signal coupler 14. At this point, correspondingly the first output end and the second output end of the dually-divided signal coupler 14 serve as the input end, and the input end serves as the output end. In other words, at this point, the dually-divided signal coupler 14 is equivalent to a signal combining element. The dually-divided signal coupler 14 combines the adjusting signal received from the first input end with the signal received from the second input end (actually, there is not a signal at the second input end) into one channel of signal, sends the signal to the antenna tuning circuit 11 for impedance matching processing, and sends the signal after being processed to the antenna 1 for emission.

In the signal processing flows of the three signal paths shown in FIG. 2 of the present embodiment, the signal path S1 and the signal path S2 process the antenna signal from the antenna, and the signal path S3 processes the emitted signal from the microprocessor of the wearable device. The present disclosure performs corresponding processing on the antenna signal through the signal path S2, which realizes dynamic adjusting of antenna signals, and improves the quality of the antenna signal.

Second Embodiment

Based on the same technical concept as that of the first embodiment, the present embodiment provides a wearable device.

Figure 3:
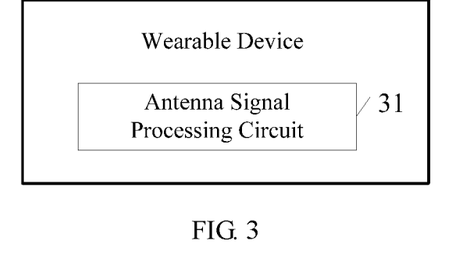
FIG. 3 is a block diagram of the structure of a wearable device according to an embodiment of the present disclosure.

FIG. 3 is a block diagram of the structure of a wearable device according to an embodiment of the present disclosure. As shown in FIG. 3, the wearable device of the present embodiment comprises an antenna signal processing circuit 31, and the antenna signal processing circuit 31 is connected between an antenna of the wearable device and a central controller CPU. The wearable device, by using the antenna signal processing circuit, realizes the adjusting of antenna signals and improves the quality of the received antenna signal.

The circuit structure of the antenna signal processing circuit 31 of the present embodiment may refer to the first embodiment, and will not be described herein again.

The wearable device of the present embodiment is a compact mobile device such as a smart watch or smart glasses. In the designing process, in order to save the space of the wearable device and reduce the number of components, the signal processor in the antenna signal processing circuit 31 is the central controller CPU of the wearable device. In other words, the judging, calculating, controlling, etc. performed by the signal processor in the antenna signal processing circuit are performed by the central controller CPU of the wearable device.

The central controller CPU of the wearable device is the computing core and controlling core of the wearable device. In practical applications, additional components may be added according to functions of the wearable device and connected to the central controller CPU. If the wearable device supports touch screen function, the display of the wearable device may be a touch screen, and the touch screen may be set to be connected to the central controller CPU.

Generally, the baseband processing circuit in the antenna signal processing circuit is also a micro-controller. Therefore, the baseband processing circuit in the antenna signal processing circuit may also be the central controller CPU of the wearable device.

Third Embodiment

Based on the same technical concept as that of the first embodiment, the present embodiment provides a method for processing an antenna signal of a wearable device.

Figure 4:
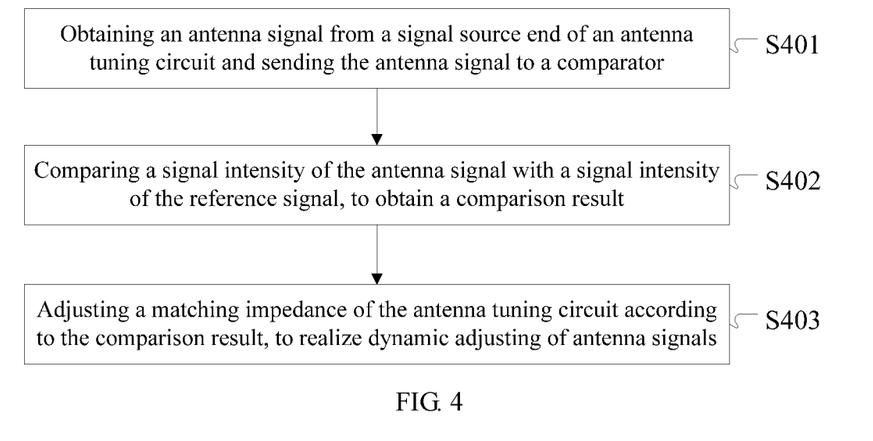
FIG. 4 is a flowchart of a method for processing an antenna signal according to an embodiment of the present disclosure.

FIG. 4 is a flowchart of a method for processing an antenna signal according to an embodiment of the present disclosure. As shown in FIG. 4, the method comprises the following steps.

S401, obtaining an antenna signal from a signal source end of an antenna tuning circuit and sending the antenna signal to a comparator.

The antenna tuning circuit comprises a controlling end, a load end and a signal source end, the load end is connected to an antenna of the wearable device, the signal source end is connected to a first input end of the comparator, a reference signal is inputted to a second input end of the comparator, an output end of the comparator is connected to an input end of the signal processor, and an output end of the signal processor is connected to the controlling end.

S402, comparing a signal intensity of the antenna signal with a signal intensity of the reference signal by using the comparator, to obtain a comparison result.

The reference signal may be obtained by the following method:

An intensity value of the antenna signal is detected, and the signal intensity value of the reference signal is updated by using the detected signal intensity value of the antenna signal. Specifically, when the comparison result is obtained, the signal intensity of the reference signal is updated by using the signal intensity value of the antenna signal at the current moment; or, when the comparison result is that the signal intensity value of the antenna signal at the current moment is greater than the signal intensity value of the reference signal, the signal intensity value of the reference signal is updated by the signal intensity value of the antenna signal at the current moment.

Correspondingly, the step of comparing a signal intensity of the antenna signal with a signal intensity of the reference signal in Step S402 is specifically: comparing a signal intensity value of the antenna signal at a next moment with a signal intensity value of the updated reference signal.

In an embodiment of the present disclosure, the signal intensity value of the detected antenna signal is an intensity value of one channel of coupled signal from the dually-divided signal coupler. In other words, this step comprises dividing the antenna signal from the antenna tuning circuit into two channels of coupled signals by using a dually-divided signal coupler, detecting a signal intensity value of one of the two channels of coupled signals in which the original signal component is relatively less, demodulating the other channel of coupled signal to obtain a demodulated signal, performing analog/digital conversion processing on the demodulated signal to obtain a digital signal, sending the digital signal to a microprocessor of the wearable device, and performing corresponding processing according to the digital signal by the microprocessor.

The present embodiment may also comprise performing digital/analog conversion processing on an emitted signal from the microprocessor to obtain an analog signal, modulating the analog signal to obtain a modulated signal, sending the modulated signal by using a dually-divided signal coupler to the antenna tuning circuit for impedance matching processing, and sending the obtained signal to the antenna for emission.

S403, adjusting a matching impedance of the antenna tuning circuit according to the comparison result, to realize dynamic adjusting of antenna signals.

For example, in the present embodiment, the capacitors in the antenna tuning circuit are voltage controlled capacitors, and the step of adjusting a matching impedance of the antenna tuning circuit according to the comparison result comprises:

adjusting a voltage value of the voltage controlled capacitor according to a current voltage adjusting mode when the signal intensity value of the antenna signal is not less than the signal intensity value of the reference signal; otherwise, changing the voltage adjusting mode and adjusting the voltage value of the voltage controlled capacitor according to the changed voltage adjusting mode.

In the present embodiment, the antenna signal after being processed by the antenna tuning circuit is compared with the reference signal, rather than comparing the RSSI value of the signal from the baseband processing circuit with the signal intensity value of the reference signal. Thus, the matching impedance of the antenna tuning circuit is adjusted based on the intensity difference between a real antenna signal and a reference signal, so that the antenna tuning circuit can use the adjusted matching impedance to perform matching processing on the subsequent antenna signals from the antenna, thereby realizing dynamic adjusting of antenna signals.

In the present embodiment, the antenna performance is optimized with respect to the influence of different individuals on the antenna performance of the wearable device, so the antenna can work at an optimal state, and the performance of antenna signals can be improved.

Figure 5:
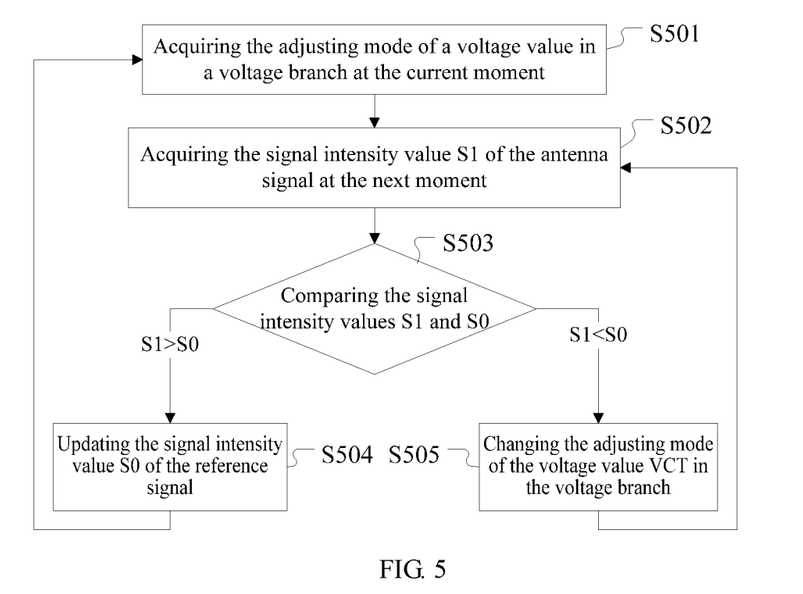
FIG. 5 is a flowchart of adjusting a voltage value VCT in a voltage branch according to an embodiment of the present disclosure.

FIG. 5 is a flowchart of adjusting a voltage value VCT in a voltage branch according to an embodiment of the present disclosure. As shown in FIG. 5, the processing flow is as follows:

S501, acquiring the adjusting mode of a voltage value in a voltage branch at the current moment.

The present embodiment is described by taking the circuit structure of the antenna tuning circuit 11 shown in FIG. 2 as an example. It is assumed that after the power-on initialization of the wearable device, the initial adjusting mode of the voltage value VCT in the voltage branch 121 by the signal processor 12 is decreasing the voltage value VCT in the voltage branch 121 according to a preset step value, and it is assumed that after the wearable device processes the antenna signal for a period of time, the adjusting mode of the voltage value VCT in the voltage branch 121 at the current moment is still decreasing the voltage value VCT in the voltage branch 121 according to the preset step value.

After the power-on initialization of the wearable device, the signal intensity value of the reference signal is initialized, and the initial signal intensity value of the reference signal may be obtained according to experimental statistics or set according to experience. When the wearable device starts to perform impedance matching processing on the antenna signal received by the wearable device, the reference signal is updated by using the signal outputted from the signal source end of the antenna tuning circuit at the current moment, so that the intensity values of the antenna signal at the next moment and of the updated reference signal are compared. Similarly, it is assumed that after the antenna signal is processed by the wearable device for a period of time, the signal intensity value of the reference signal is updated to S0.

S502, acquiring the signal intensity value S1 of the antenna signal at the next moment.

S503, comparing the signal intensity values S1 and S0, and when S1>S0, performing Step S504; otherwise, performing Step 505.

S504, updating the signal intensity value S0 of the reference signal, that is, updating the signal intensity value S0 of the reference signal by using the signal intensity value S1 of the antenna signal at the next moment; and after the updating, performing Step S501, continuing to adjust the voltage value VCT in the voltage branch 121 according to the current adjusting mode, that is, continuing to decrease the voltage value VCT in the voltage branch 121 by a preset step value.

In S505, changing the adjusting mode of the voltage value VCT in the voltage branch, returning to Step S502 and continuing to acquire the signal intensity value S1 of the antenna signal at the next moment.

If based on the above assumption, the adjusting mode of the voltage value VCT at the current moment is decreasing the voltage value VCT in the voltage branch 121 according to the preset step value, the adjusting mode of the voltage value VCT is changed at this point to increasing the voltage value VCT in the voltage branch 121 according to the preset step value. The matching impedance of the antenna tuning circuit is adjusted according to the changed adjusting mode of the voltage value VCT (that is, increasing the voltage value VCT in the voltage branch 121 according to the preset step value), so that the antenna of the wearable device can work in an optimal state, to improve the performance of antenna signals.

The above steps S501 to S505 describe the flow of dynamically adjusting the antenna signal of the wearable device.

In order to facilitate clearly describing the technical solutions of the present disclosure, the words "first", "second" and the like are used in the embodiments of the present disclosure to distinguish the same or similar items whose functions are substantially the same. The skilled in the art will understand that the words "first", "second" and the like do not limit the quantity and execution order.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the invention as set forth in the appended claims and their legal equivalents.

What is claimed is:

1. An antenna signal processing circuit of a wearable device, wherein the antenna signal processing circuit comprises an antenna tuning circuit, a signal processor and a comparator;

the antenna tuning circuit comprises a controlling end, a load end and a signal source end, the load end is connected to an antenna of the wearable device, the signal source end is connected to a first input end of the comparator, a reference signal is inputted to a second input end of the comparator, an output end of the comparator is connected to an input end of the signal processor, and an output end of the signal processor is connected to the controlling end; and the signal processor generates an adjusting signal according to a comparison result outputted by the comparator, to adjust a matching impedance of the antenna tuning circuit, to realize dynamic adjusting of antenna signals.

2. The antenna signal processing circuit according to claim 1, wherein the antenna signal processing circuit further comprises a signal detecting circuit and a signal register;

an input end of the signal detecting circuit is connected to the signal source end of the antenna tuning circuit, two output ends of the signal detecting circuit are respectively connected to the first input end of the comparator and the signal register, and the signal register stores a signal intensity value of the reference signal and is respectively connected to the second input end of the comparator and the signal processor;

the signal detecting circuit detects a signal intensity value from the signal source end of the antenna tuning circuit, and sends the detected signal intensity value to the comparator and the signal register respectively;

the signal register updates the signal intensity value of the reference signal by using the signal intensity value according to a controlling signal from the signal processor, so that the comparator compares a signal intensity value at a next moment with a signal intensity value of the updated reference signal.

3. The antenna signal processing circuit according to claim 2, wherein the antenna signal processing circuit further comprises a radio frequency circuit, a baseband processing circuit and a coupler; and an input end of the coupler is connected to the signal source end of the antenna tuning circuit, a first output end of the coupler is connected to one end of the radio frequency circuit, a second output end of the coupler is connected to the input end of the signal detecting circuit, the other end of the radio frequency circuit is connected to the baseband processing circuit, and the baseband processing circuit, the radio frequency circuit, the coupler and the antenna tuning circuit form a radio frequency passageway of antenna signals.

4. The antenna signal processing circuit according to claim 3, wherein the antenna tuning circuit comprises: a first inductor LL a first capacitor C1 and a second capacitor C2;

one end of the first inductor L1 is connected to the load end of the antenna tuning circuit, and the other end of the first inductor L1 is connected to the signal source end of the antenna tuning circuit;

one end of the first capacitor C1 is connected to the signal source end, and the other end of the first capacitor C1 is grounded; and one end of the second capacitor C2 is connected to the load end, and the other end of the second capacitor C2 is grounded.

5. The antenna signal processing circuit according to claim 4, wherein the antenna signal processing circuit further comprises a first DC blocking capacitor C3 and a second DC blocking capacitor C4, the first DC blocking capacitor C3 is connected between the input end of the coupler and the signal source of the antenna tuning circuit, and the second DC blocking capacitor C4 is connected between the load end of the antenna tuning circuit and the antenna.

6. The antenna signal processing circuit according to claim 4, wherein the first capacitor C1 and the second capacitor C2 are both voltage controlled capacitors, and the signal processor comprises a voltage branch that adjusts capacitance values of the voltage controlled capacitors; and the signal processor increases or decreases a voltage value of the voltage branch by a preset step value according to the comparison result, to correspondingly change capacitance values of the first capacitor C1 and the second capacitor C2.

7. The antenna signal processing circuit according to claim 6, wherein the signal processor comprises one voltage branch, and the voltage branch is used to adjust the capacitance values of the first capacitor C1 and the second capacitor C2 in the antenna tuning circuit to change synchronously; or the signal processor comprises one first voltage branch and one second voltage branch, the first voltage branch is used to adjust a capacitance value of the first capacitor C1 in the antenna tuning circuit, and the second voltage branch is used to adjust a capacitance value of the second capacitor C2 in the antenna tuning circuit.

8. A wearable device comprising an antenna signal processing circuit, and the antenna signal processing circuit is connected between an antenna of the wearable device and a central controller;

wherein the antenna signal processing circuit comprises an antenna tuning circuit, a signal processor and a comparator;

the antenna tuning circuit comprises a controlling end, a load end and a signal source end, the load end is connected to an antenna of the wearable device, the signal source end is connected to a first input end of the comparator, a reference signal is inputted to a second input end of the comparator, an output end of the comparator is connected to an input end of the signal processor, and an output end of the signal processor is connected to the controlling end; and the signal processor generates an adjusting signal according to a comparison result outputted by the comparator, to adjust a matching impedance of the antenna tuning circuit, to realize dynamic adjusting of antenna signals.

9. The wearable device according to claim 8, wherein the signal processor in the antenna signal processing circuit is a central controller of the wearable device.

10. A method for processing an antenna signal of a wearable device, comprising:

obtaining an antenna signal from a signal source end of an antenna tuning circuit and sending the antenna signal to a comparator, wherein the antenna tuning circuit comprises a controlling end, a load end, and the signal source end, the load end is connected to an antenna of the wearable device, the signal source end is connected to a first input end of the comparator, a reference signal is inputted to a second input end of the comparator, an output end of the comparator is connected to an input end of a signal processor, and an output end of the signal processor is connected to the controlling end;

comparing a signal intensity of the antenna signal with a signal intensity of the reference signal by using the comparator, to obtain a comparison result; and adjusting a matching impedance of the antenna tuning circuit according to the comparison result, to realize dynamic adjusting of antenna signals.

11. The method for processing an antenna signal according to claim 10, wherein the reference signal is obtained by the following step: detecting a signal intensity value of the antenna signal and updating a signal intensity value of the reference signal by using the detected signal intensity value of the antenna signal; and the step of comparing a signal intensity of the antenna signal with a signal intensity of the reference signal is specifically: comparing a signal intensity value of the antenna signal at a next moment with a signal intensity value of the updated reference signal.

12. The method for processing an antenna signal according to claim 10, wherein the antenna tuning circuit further comprises a voltage controlled capacitor, and the step of adjusting a matching impedance of the antenna tuning circuit according to the comparison result comprises: adjusting a voltage value of the voltage controlled capacitor according to a current voltage adjusting mode when the signal intensity value of the antenna signal is not less than the signal intensity value of the reference signal; otherwise, changing the voltage adjusting mode and adjusting the voltage value of the voltage controlled capacitor according to the changed voltage adjusting mode.

13. The method for processing an antenna signal according to claim 11, wherein the step of detecting a signal intensity value of the antenna signal comprises:
dividing the antenna signal from the antenna tuning circuit into two channels of coupled signals by using a dually-divided signal coupler; and
detecting a signal intensity value of one of the two channels of coupled signals in which the original signal component is relatively less, and demodulating the other channel of coupled signal to obtain a demodulated signal.

14. The method for processing an antenna signal according to claim 13, wherein after obtaining the demodulated signal, the method further comprises:
performing analog/digital conversion processing on the demodulated signal to obtain a digital signal and sending the digital signal to a microprocessor of the wearable device; and
performing corresponding processing according to the digital signal by the microprocessor.

15. The method for processing an antenna signal according to claim 14, further comprising:
performing digital/analog conversion processing on an emitted signal from the microprocessor to obtain an analog signal;
modulating the analog signal to obtain a modulated signal; and
sending the modulated signal by using a dually-divided signal coupler to the antenna tuning circuit for impedance matching processing, and sending the obtained signal to the antenna for emission.

16. The wearable device according to claim 8, wherein the antenna signal processing circuit further comprises a signal detecting circuit and a signal register;
an input end of the signal detecting circuit is connected to the signal source end of the antenna tuning circuit, two output ends of the signal detecting circuit are respectively connected to the first input end of the comparator and the signal register, and the signal register stores a signal intensity value of the reference signal and is respectively connected to the second input end of the comparator and the signal processor;
the signal detecting circuit detects a signal intensity value from the signal source end of the antenna tuning circuit, and sends the detected signal intensity value to the comparator and the signal register respectively;
the signal register updates the signal intensity value of the reference signal by using the signal intensity value according to a controlling signal from the signal processor, so that the comparator compares a signal intensity value at a next moment with a signal intensity value of the updated reference signal.

17. The wearable device according to claim 16, wherein the antenna signal processing circuit further comprises a radio frequency circuit, a baseband processing circuit and a coupler; and
an input end of the coupler is connected to the signal source end of the antenna tuning circuit, a first output end of the coupler is connected to one end of the radio frequency circuit, a second output end of the coupler is connected to the input end of the signal detecting circuit, the other end of the radio frequency circuit is connected to the baseband processing circuit, and the baseband processing circuit, the radio frequency circuit, the coupler and the antenna tuning circuit form a radio frequency passageway of antenna signals.

18. The wearable device according to claim 17, wherein the antenna tuning circuit comprises: a first inductor L1, a first capacitor C1 and a second capacitor C2;
one end of the first inductor L1 is connected to the load end of the antenna tuning circuit, and the other end of the first inductor L1 is connected to the signal source end of the antenna tuning circuit;
one end of the first capacitor C1 is connected to the signal source end, and the other end of the first capacitor C1 is grounded; and
one end of the second capacitor C2 is connected to the load end, and the other end of the second capacitor C2 is grounded.

19. The wearable device according to claim 18, wherein the antenna signal processing circuit further comprises a first DC blocking capacitor C3 and a second DC blocking capacitor C4, the first DC blocking capacitor C3 is connected between the input end of the coupler and the signal source of the antenna tuning circuit, and the second DC blocking capacitor C4 is connected between the load end of the antenna tuning circuit and the antenna.

20. The wearable device according to claim 18, wherein the first capacitor C1 and the second capacitor C2 are both voltage controlled capacitors, and the signal processor comprises a voltage branch that adjusts capacitance values of the voltage controlled capacitors; and
the signal processor increases or decreases a voltage value of the voltage branch by a preset step value according to the comparison result, to correspondingly change capacitance values of the first capacitor C1 and the second capacitor C2; wherein
the signal processor comprises one voltage branch, and the voltage branch is used to adjust the capacitance values of the first capacitor C1 and the second capacitor C2 in the antenna tuning circuit to change synchronously; or
the signal processor comprises one first voltage branch and one second voltage branch, the first voltage branch is used to adjust a capacitance value of the first capacitor C1 in the antenna tuning circuit, and the second voltage branch is used to adjust a capacitance value of the second capacitor C2 in the antenna tuning circuit.

* * * * *